US010451657B2

(12) United States Patent
Reymond et al.

(10) Patent No.: US 10,451,657 B2
(45) Date of Patent: Oct. 22, 2019

(54) CURRENT SENSING SYSTEM AND CURRENT SENSING METHOD

(71) Applicant: Monolithic Power Systems, Inc., San Jose, CA (US)

(72) Inventors: Serge Reymond, Geneva (CH); Pavel Kejik, Ecublens (CH)

(73) Assignee: Monolithic Power Systems, Inc., San Jose, CA (US)

( * ) Notice: Subject to any disclaimer, the term of this patent is extended or adjusted under 35 U.S.C. 154(b) by 129 days.

(21) Appl. No.: 15/676,939

(22) Filed: Aug. 14, 2017

(65) Prior Publication Data

US 2018/0246147 A1 Aug. 30, 2018

(30) Foreign Application Priority Data

Feb. 24, 2017 (EP) ..................... 17157945

(51) Int. Cl.
*G01R 15/20* (2006.01)
*G01R 33/07* (2006.01)
*G11C 11/15* (2006.01)
*H01L 43/04* (2006.01)
*H01L 43/06* (2006.01)
*G01R 19/00* (2006.01)

(52) U.S. Cl.
CPC ......... *G01R 15/202* (2013.01); *G01R 15/207* (2013.01); *G01R 33/075* (2013.01); *G11C 11/15* (2013.01); *H01L 43/04* (2013.01); *H01L 43/065* (2013.01); *G01R 19/0092* (2013.01)

(58) Field of Classification Search
CPC .... G01R 15/202; G01R 15/207; G01R 19/00; G01R 19/92
See application file for complete search history.

(56) References Cited

U.S. PATENT DOCUMENTS

| 5,488,250 | A  | * | 1/1996 | Hennig | ..................... | G11B 5/37 257/421 |
| 6,727,563 | B1 | * | 4/2004 | Hohe | ..................... | G01R 33/07 257/426 |
| 8,357,983 | B1 | * | 1/2013 | Wang | ..................... | G01R 33/07 257/257 |
| 9,395,423 | B2 |   | 7/2016 | Ausserlechner | | |

(Continued)

FOREIGN PATENT DOCUMENTS

WO WO-2016035039 A1 * 3/2016 ......... G01R 33/0088

OTHER PUBLICATIONS

U.S. Appl. No. 14/943,509, filed Nov. 17, 2015, Seiko Instruments Inc.

(Continued)

*Primary Examiner* — Tung X Nguyen
*Assistant Examiner* — Dominic E Hawkins
(74) *Attorney, Agent, or Firm* — Perkins Coie LLP

(57) ABSTRACT

A current sensing system uses a Hall effect device. A conductor carrying a target current is shaped in a way such that two regions with opposite magnetic field directions crossed there through are created at a silicon die which contains the Hall effect devices placed in a mirror way. The Hall effect devices react the magnetic field to generate a Hall voltage when a bias current is applied, which is then processed by a process circuit and an operational unit, so that a differential signal indicative of the target current is generated.

18 Claims, 10 Drawing Sheets

(56) References Cited

U.S. PATENT DOCUMENTS

| | | | |
|---|---|---|---|
| 9,411,025 B2 | 8/2016 | David et al. | |
| 9,448,288 B2 | 9/2016 | Diaconu | |
| 9,612,262 B1* | 4/2017 | Nehmeh | G01R 15/202 |
| 2004/0251507 A1* | 12/2004 | Nakamura | G01R 33/07 |
| | | | 257/421 |
| 2012/0286776 A1* | 11/2012 | Ausserlechner | G01R 33/07 |
| | | | 324/251 |
| 2013/0265041 A1* | 10/2013 | Friedrich | G01R 15/207 |
| | | | 324/260 |
| 2013/0342196 A1* | 12/2013 | Ausserlechner | G01R 33/07 |
| | | | 324/251 |
| 2014/0070795 A1* | 3/2014 | Kolb | G01R 33/07 |
| | | | 324/202 |
| 2015/0022196 A1* | 1/2015 | Hebiguchi | G01R 15/207 |
| | | | 324/244 |
| 2015/0070002 A1* | 3/2015 | Schott | G01D 5/145 |
| | | | 324/207.2 |
| 2016/0209479 A1* | 7/2016 | Hegedus | G01R 33/07 |
| 2017/0205472 A1* | 7/2017 | Wang | G01R 33/0005 |

OTHER PUBLICATIONS

U.S. Appl. No. 14/949,237, filed Nov. 23, 2015, Infineon Technologies AG.

* cited by examiner

CURRENT SENSING SYSTEM AND CURRENT SENSING METHOD

CROSS-REFERENCE TO RELATED APPLICATIONS

This application claims priority to and the benefit of European Patent Application No. 17157945.1, filed Feb. 24, 2017, which is incorporated herein by reference in its entirety

TECHNICAL FIELD

The present invention generally relates to sensor, and more particularly but not exclusively relates to current sensing system and current sensing method.

BACKGROUND OF THE INVENTION

Hall effect devices are used in various applications. One application that Hall effect devices are used is in the area of current sensors. A typical integrated planar Hall effect device is shown in FIG. 1A. As shown in FIG. 1A, the Hall effect device has two pairs of connectors (a first pair of connectors C1 & C2, and a second pair of connectors C3 & C4). FIG. 1B schematically shows the Hall effect device in FIG. 1A with a cross-section view along the CP slice. As shown in FIG. 1B, the connectors are N-type highly doped regions (N+) formed in an N-type well region (N-well), which is formed on a P-type substrate (P-sub). When a magnetic field B is applied perpendicular to a plane of the Hall effect device, and a current is applied to one pair of the connectors (e.g. C1 & C2), a Hall voltage will be generated in the other pair of the connectors (e.g. C3 & C4). A depletion layer which functions as an isolation layer is generated at the junction of the N-well and the P-sub when the current is applied to the Hall effect device and an appropriate voltage level is applied to the P-sub with respect to the voltage level of the connectors.

However, the accuracy of current sensing based on Hall effect devices may suffer from parasitic field and temperature drifts of the magnetic field B, and parasitic spikes due to switching of power switches in a power stage. Efforts such as spinning current technique which controls the current applied to the Hall effect device and the resulted Hall voltage to be spinning between the two pairs of the connectors are adopted to alleviate the current sense accuracy issues, but further improvement is still needed.

SUMMARY

It is an object of the present invention to provide an improved current sensor, which solves the above problems.

In accomplishing the above and other objects, there has been provided, in accordance with an embodiment of the present invention, a current sensing system, comprising: a silicon die; and a conductor, part of the conductor shaped to carry a target current in a way such that a first magnetic region and a second magnetic region are created at the silicon die, and magnetic fields with opposite directions respectively crosses through the first magnetic region and the second magnetic region, the silicon die having N Hall effect devices in each of the magnetic regions, half of the N Hall effect devices in each of the magnetic regions being placed at one side of a mid-line, another half of N Hall effect devices in each of the magnetic regions being placed at the other side of the mid-line, the two halves of the Hall effect blocks being placed symmetrically with each other along the mid-line, N being a positive even number, each Hall effect device being applied with a bias current to provide a Hall voltage, wherein the silicon die further comprises: two process circuits, configured to respectively process the Hall voltages from each side of the mid-line, to generate two processed signals; and an operational unit, configured to execute a subtraction operation or an add operation on the two processed signals to generate an operational signal.

In addition, there has been provided, in accordance with an embodiment of the present invention, a current sensing method, comprising: shaping part of a conductor to create a first magnetic region and a second magnetic region at a silicon die when a target current is flowing through the conductor, and magnetic fields with opposite directions crossing through the first magnetic region and the second magnetic region; placing N Hall effect devices in each of the magnetic regions at a silicon die, half of the N Hall effect devices in each of the magnetic regions being placed in one side of a mid-line, another half of N Hall effect devices in each of the magnetic regions being placed in the other side of the mid-line, the two halves of the Hall effect devices being placed in a mirrored way to each other along the mid-line, N being a positive even number; applying a bias current to the Hall effect device in each of the magnetic regions with spinning scheme, so that a Hall voltage is generated by each of the Hall effect devices; processing the Hall voltages at each side of the mid-line to generate two processed signals; and executing a subtraction operation or an add operation on the processed signals to generate an operational signal.

Furthermore, there has been provided, in accordance with an embodiment of the present invention, a current sensing system, comprising: a silicon die; and a conductor, part of the conductor shaped to carry a target current in a way such that a first magnetic region and a second magnetic region are created at the silicon die, and magnetic fields with opposite directions respectively crosses through the first magnetic region and the second magnetic region, the silicon die having a first portion and a second portion, each portion including: at least two Hall effect devices placed at the first and second magnetic regions, respectively, each Hall effect device being applied with a bias current to provide a Hall voltage, wherein the Hall effect devices in the first portion are laid in a mirrored way with the Hall effect devices in the second portion; and a process circuit, configured to process the Hall voltage to generate a processed signal; and wherein the silicon die further comprises: an operational unit, configured to execute a subtraction operation or an add operation on the processed signals to generate an operational signal.

The use of the similar reference label in different drawings indicates the same of like components.

DETAILED DESCRIPTION

Embodiments of circuits for current sensing system are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1A:
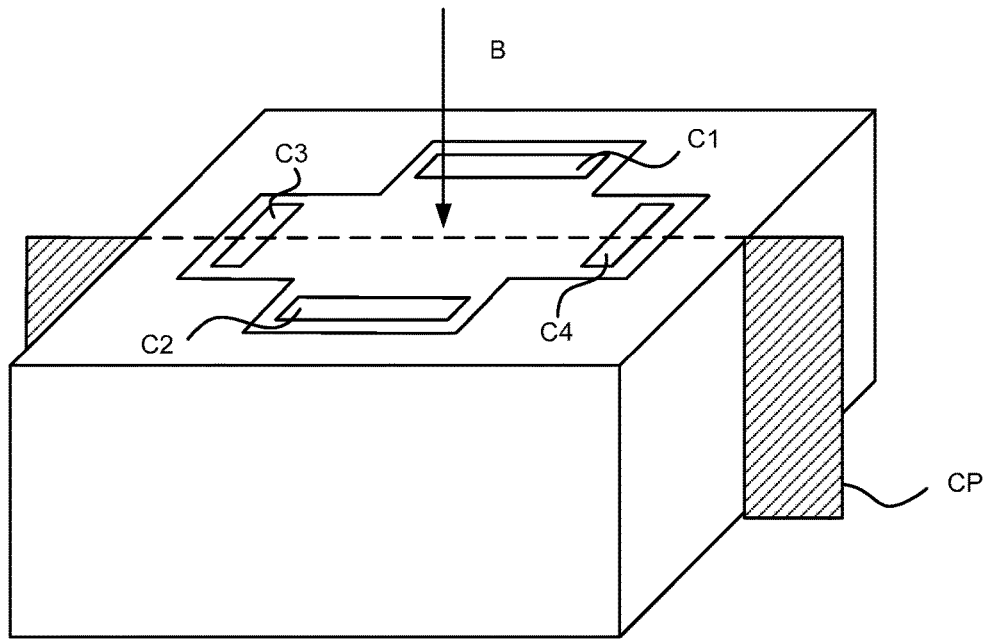
FIG. 1A schematically shows a typical integrated planar hall effect device.
Figure 1B:
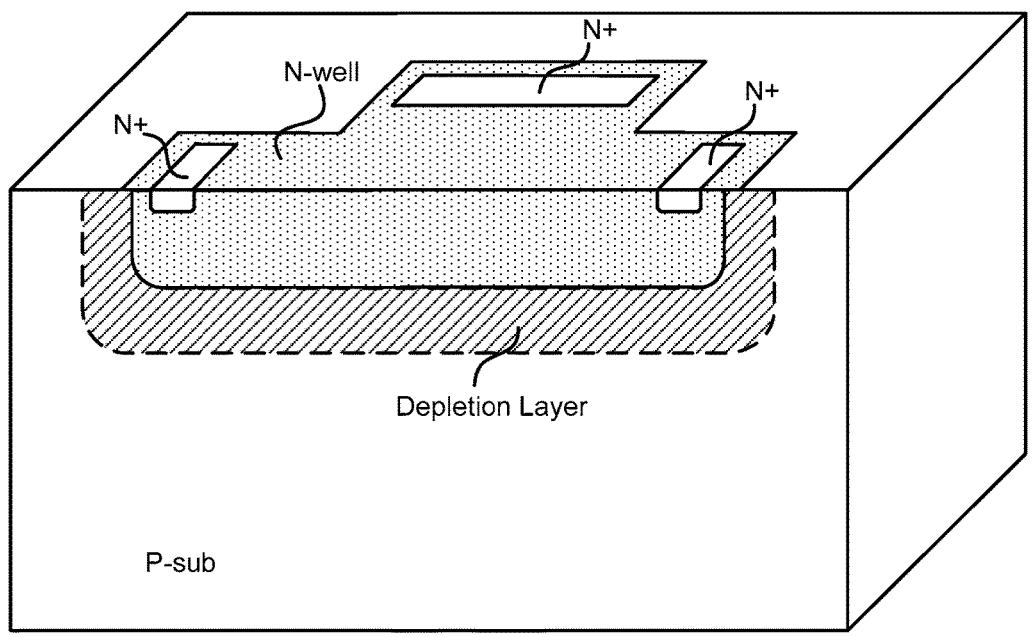
FIG. 1B schematically shows the Hall effect device in FIG. 1 with a cross-section view along the CP slice.
Figure 2:
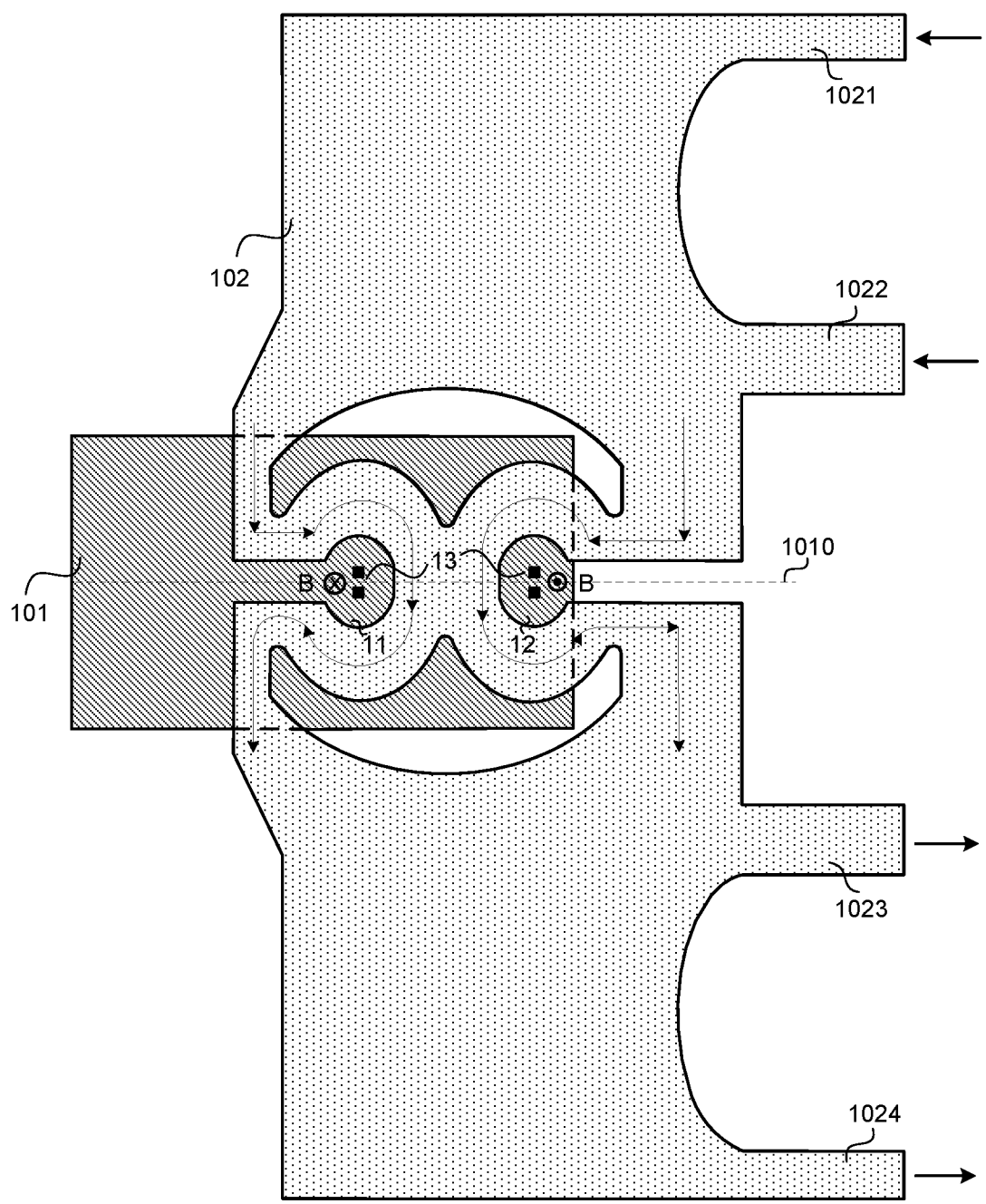
FIG. 2 schematically shows a current sensing system in accordance with an embodiment of the present invention.

FIG. 2 schematically shows a current sensing system in accordance with an embodiment of the present invention. As shown in FIG. 2, the current sensing system comprises: a silicon die 101; and a conductor 102, wherein part of the conductor 102 is shaped to carry a target current in a way such that two magnetic regions (a first magnetic region 11 and a second magnetic region 12) with opposite magnetic fields B crossed therethrough are created at the silicon die 101. As shown in FIG. 2, when the current flows through the conductor 102 in the shown direction, the magnetic field B crossing through the first magnetic region 11 has a direction pointing into the plane (labeled as cross), and the magnetic field B crossing through the second magnetic region 12 has a direction pointing out of the plane (labeled as a dot). However, one of ordinary skill should realize that the current flowing through the conductor 102 may have another direction, so that the first magnetic region 11 is with a magnetic field B crossing through the silicon 101 with a direction pointing out of the plane, and the second magnetic region 12 is with a magnetic field B crossing through the silicon 101 with a direction pointing into the plane. The target current is the current that needs to be sensed. The silicon die 101 has N Hall effect devices 13 in each of the magnetic regions, wherein N is a positive even number. Half of the Hall effect devices in each of the magnetic regions are placed at one side of a mid-line 1010, and another half of the Hall effect devices in each of the magnetic region are placed at the other side of the mid-line 1010. That is, the number of Hall effect devices in each of the magnetic regions is a multiple of 2 (i.e. 2, 4, 6, 8, etc), and the total number of Hall effect devices in the silicon die 101 is a multiple of 4 (i.e., 4, 8, 12, 16, etc). The two halves of the Hall effect devices are placed in a mirrored way (i.e., each half is symmetrically placed with a corresponding other half) to each other along the mid-line 1010, which will be further shown and discussed further with reference to FIG. 6 and FIG. 8.

The mid-line 1010 is a line along which the first magnetic region 11 and the second magnetic region 12 can be "folded" and divided into two symmetric halves, respectively.

In one embodiment, the Hall effect device is coupled to a switch box to perform so-called spinning current, which will be discussed further with reference to FIG. 4.

In one embodiment, the silicon die 101 is with a surface mount package. However, in other embodiments, the silicon die 101 can be with any other suitable packages.

In one embodiment, the conductor 102 comprises a lead frame, which is shaped as shown in FIG. 2.

In one embodiment, the conductor 102 has four fingers (lead fingers) 1021, 1022, 1023 and 1024, with two fingers (e.g., 1021 and 1022) flowing into the target current, and the other two finger (e.g. 1023 and 1024) flowing out the target current.

Figure 3:
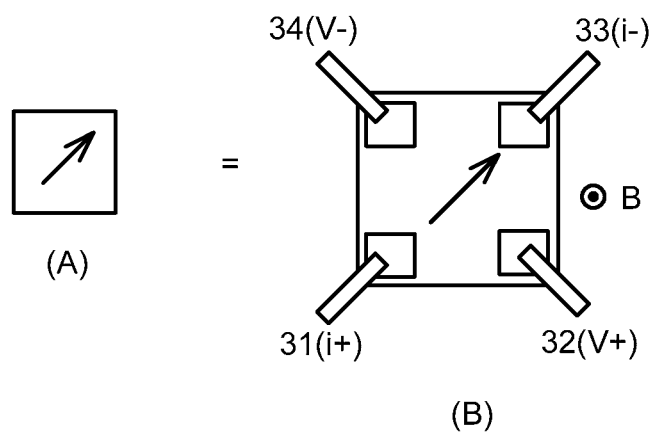
FIG. 3 schematically shows a Hall effect device in accordance with an embodiment of the present invention.

FIG. 3 schematically shows a Hall effect device in accordance with an embodiment of the present invention. As shown in FIG. 3, the Hall effect device comprises two pairs of connectors (31 & 33 and 32 & 34). In the example of FIG. 3, a bias current is applied from connector 31 to connector 33 in a vertical magnetic field B pointing into the plane. As a result, a Hall voltage is generated between connectors 32 and 34, wherein connector 32 is with a positive polarity, and connector 34 is with a negative polarity. For illustration purpose, the Hall effect device in FIG. 3B will be illustrated as in FIG. 3A in the following discussion.

Figure 4:
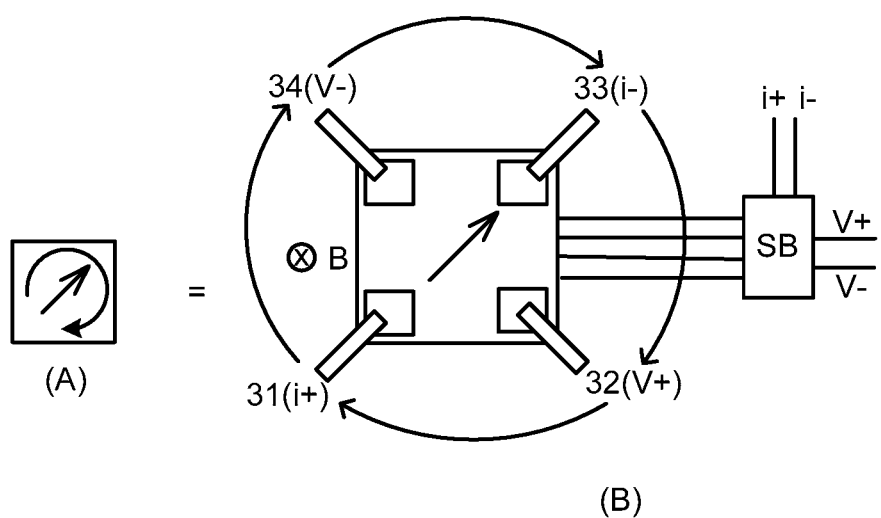
FIG. 4 schematically shows a spinning Hall effect device in accordance with an embodiment of the present invention.

FIG. 4 schematically shows a spinning Hall effect device (i.e., a Hall effect device coupled with a switch box) in accordance with an embodiment of the present invention. In the example of FIG. 4, the spinning Hall effect device comprises: a Hall device as a sensing element having two pairs of connectors (31 & 33, and 32 & 34), with one pair of connectors configured to receive a bias current, and the other pair of connectors configured to generate a Hall voltage in response to the bias current and a vertical magnetic field B; and a switch box (SB), configured to control the bias current running in the Hall device and the sensed Hall voltage to be spinning between the two pairs of the connectors. In the example of FIG. 4, the spinning direction is clockwise, which means that in the immediately coming cycle, the bias current will be applied from connector 34 to connector 32 (i.e. the bias current will be shifted to connectors 34 & 32 from connectors 31 & 33), and the Hall voltage will be generated between connectors 31 and 33. For illustration purpose, the spinning Hall effect device in FIG. 4B will be illustrated as in FIG. 4A in the following discussion.

Figure 5:
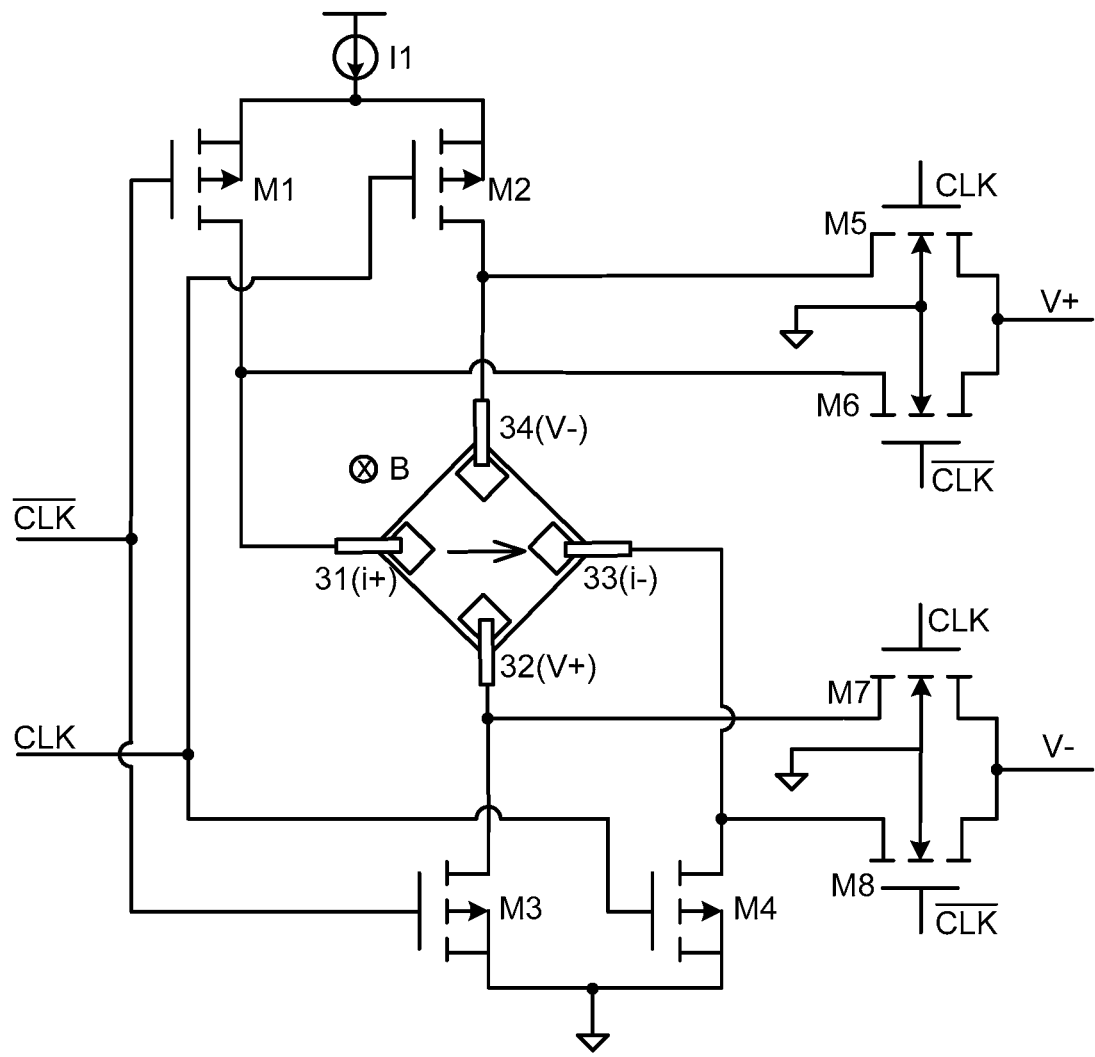
FIG. 5 schematically shows a spinning Hall effect device with a detailed configuration of the switch box in accordance with an embodiment of the present invention.

FIG. 5 schematically shows a spinning Hall effect device with a detailed configuration of the switch box in accordance with an embodiment of the present invention. In the example of FIG. 5, the switch box includes: a first switch pair (M1 & M2), coupled between a current source 11 and two connectors (31 & 34) of the Hall effect device; a second switch pair (M3 & M4), coupled between two connectors (32 & 33) of the Hall effect device and ground; a third switch pair (M5 & M6), coupled between two connectors (31 & 34) of the Hall effect device and a first output terminal V+; and a fourth switch pair (M7 & M8), coupled between two connectors (32 & 33) of the Hall effect device and a second output terminal V−, wherein a voltage difference between the first output terminal V+ and the second output terminal V− is the Hall voltage, and wherein each switch pair has one switch controlled by a control signal (CLK), and the other switch controlled by an inverted signal of the control signal ($\overline{CLK}$). In that way the Hall signal is modulated with the control signal (CLK). The operation principle of the switch box is well known in the art, which will not be discussed for briefly.

Figure 6:
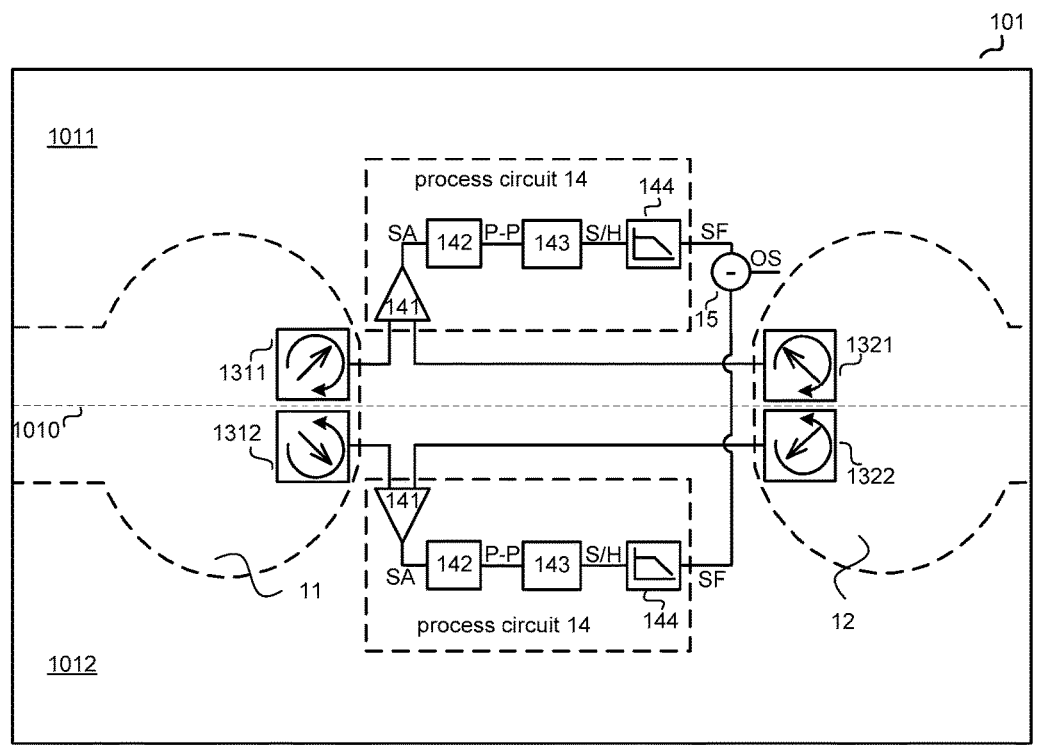
FIG. 6 schematically shows a circuit configuration of the silicon die 101 in accordance with an embodiment of the present invention.

FIG. 6 schematically shows a circuit configuration of the silicon die 101 in accordance with an embodiment of the present invention. In the example of FIG. 6, the silicon die 101 has two portions (a first portion 1011 and a second portion 1012) having a same circuit configuration at the two sides of the mid-line 1010, respectively. Each portion includes: two Hall effect devices, placed in the first magnetic region 11 and the second magnetic region 12, respectively, each Hall effect device configured to provide a Hall voltage (or called as a differential signal) in response to a spinning current applied thereto; and a process circuit 14, configured to process the Hall voltages to generate a processed signal.

Continue referring to FIG. 6, the first portion 1011 has a first Hall effect device 1311 & a second Hall effect device 1321, while the second portion 1012 has a first Hall effect device 1312 & a second Hall effect device 1322. The first Hall effect devices 1311 and 1312 are laid in a mirror way (i.e. they are placed symmetrically with each other along the mid-line 1010), and with mirror bias current directions and mirror spinning current schemes. Likewise, the second Hall effect devices 1321 and 1322 are also laid in a mirror way and with mirror bias current directions and mirror spinning current schemes. Specifically, in the example of FIG. 6, the bias current applied to the first Hall effect devices 1311 in the first portion 1011 rotates clockwise and has an initial current direction pointing from bottom left corner to top right corner, whereas the bias current applied to the first Hall effect device 1312 in the second portion 1012 rotates counterclockwise and has an initial current direction pointing from top left corner to bottom right corner. The second Hall effect device 1321 in the first portion 1011 rotates clockwise and has an initial current direction pointing from bottom right corner to top left corner, whereas the second Hall effect device 1322 in the second portion 1012 rotates counterclockwise and has an initial current direction pointing from top right corner to bottom left corner.

The switch box which provides the bias current to the Hall effect devices is placed anywhere at the corresponding Hall effect device proximity. In one embodiment, it may be placed inside the magnetic region. In other embodiments, it may be placed outside the magnetic region.

Due to the Hall effect devices in each of the magnetic regions are laid in a mirror way and with mirror bias current directions and mirror spinning current schemes with each other as discussed above, the Hall voltages generated at two sides of the mid-line 1010 are with opposite polarities with each other, whereas parasitic signals generated due to switching of switches in a power stage have the same polarities.

In the example of FIG. 6, the silicon die 101 further comprises: an operational unit 15, configured to receive the processed signals from the first portion 1011 and the second portion 1012, to execute a subtraction operation or an add operation on the two processed signals to generate an operational signal (OS). In the example of FIG. 6, the operational unit 15 is shown as placed in the first portion 1011. However, one of ordinary skill in the art should realize that the operational amplifier 15 may be placed in either portion.

In one embodiment, the operation unit 15 comprises a subtractor.

In the example of FIG. 6, the process circuit 14 in each of the portions comprises: an operational amplifier (or called as a differential difference amplifier) 141, configured to respectively sum the Hall voltages generated by the half Hall effect devices in the first magnetic region 11 at one side of the mid-line 1010 (i.e. by the half Hall effect devices placed in both of the first magnetic region 11 and the corresponding portion), and the Hall voltages generated by the half Hall effect devices in the second magnetic region 12 at one side of the mid-line 1010 (i.e. by the half Hall effect devices placed in both of the second magnetic region 12 and the corresponding portion), and to amplify a difference between the summed results to generate an amplified signal SA; a peak to peak detector 142, coupled to the operational amplifier 141 to receive the amplified signal SA, to generate a peak-peak signal (P-P) indicative of the difference between a maximum value and a minimum value of the amplified signal SA; a sample and hold circuit 143, coupled to the peak to peak detector 142 to receive the peak-peak signal (P-P), to generate a sample-hold signal (S/H); and a filter 144, coupled to the sample and hold circuit 143 to receive the sample-hold signal (S/H), to generate the processed signal (SF) based on the sample-hold signal (S/H).

During the operation of the system, when the target current is applied to the conductor 102, due to the shape of the conductor, two magnetic fields with opposite directions crossed therethrough are generated in the magnetic regions 11 and 12, respectively. So in each portion, the Hall voltages generated in the first magnetic region 11 and the second magnetic region 12 are with opposite polarities with each other. In addition, as discussed hereinbefore, the Hall voltages in each side of the mid-line 1010 are with opposite polarities, too. The Hall voltages are then processed by the process circuit 14 and the operational unit 15. Thus the operational signal (OS) provided by the operational unit 15 reflects the magnetic field intensity of the magnetic regions, which is generated by the target current. So the operational signal (OS) is indicative of the target current. Thus current sense is achieved by the current sensing system discussed above.

Figure 7:
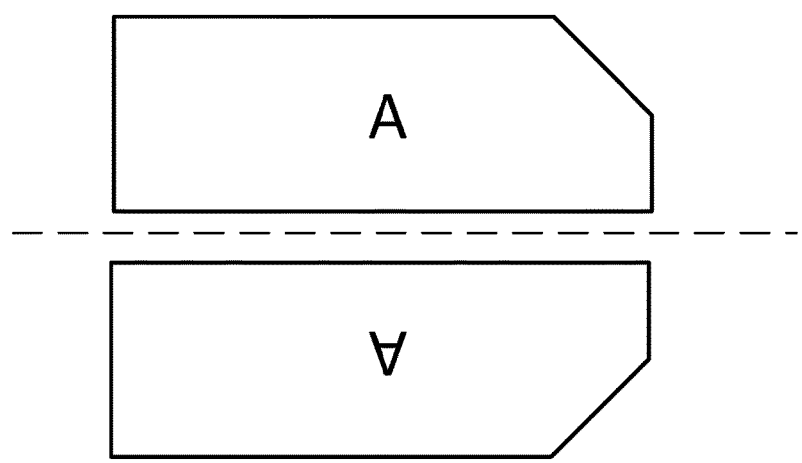
FIG. 7 schematically shows a "mirror" layout example in accordance with an embodiment of the present invention.

FIG. 7 schematically shows a "mirror" layout example in accordance with an embodiment of the present invention.

Figure 8:
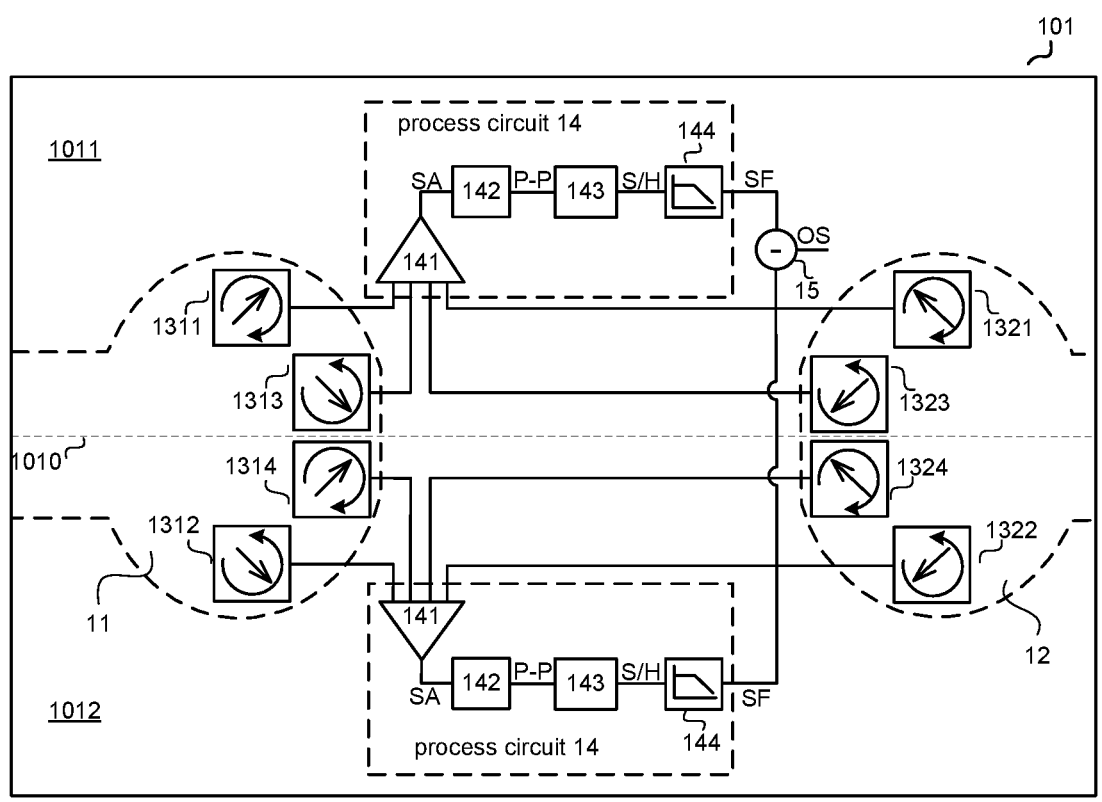
FIG. 8 schematically shows a circuit configuration of the silicon die 101 with four Hall effect devices in each of the magnetic regions in accordance with an embodiment of the present invention.

FIG. 8 schematically shows a circuit configuration of the silicon die 101 with four Hall effect devices in each of the magnetic regions in accordance with an embodiment of the present invention. In each of the magnetic regions, two Hall effect devices are placed in the first portion 1011, and the other two Hall effect devices are placed in the second portion 1012; the two Hall effect devices in the first portion 1011 and the two Hall effect devices in the second portion 1012 are laid in a mirrored way to each other along the mid-line 1010, and with mirrored bias current directions and mirrored spinning current schemes. Each of the Hall effect devices is placed along the boundary (shown as dashed arc line) of the conductor 102 and is configured to provide a Hall voltage (or called as a differential signal). The other circuits of the silicon die 101 in the example of FIG. 8 are similar to that in FIG. 6.

In one embodiment, the two Hall effect devices placed in each quarter (e.g. the upper half of the first magnetic region 11 in the first portion 1011, the lower half of the first magnetic region 11 in the second portion 1012, the upper half of the second magnetic region 12 in the first portion, or the lower half of the second magnetic region 12 in the second portion 1012) are applied with opposite bias current directions and opposite spinning current schemes.

Specifically, as shown in FIG. 8, in the first magnetic region 11, the Hall effect device 1311 has a bias current rotating clockwise and with an initial current direction pointing from bottom left corner to top right corner, its mirrored Hall effect device 1312 has a bias current rotating counterclockwise and with an initial current direction pointing from top left corner to bottom right corner; the Hall effect device 1313 has a bias current rotating counterclockwise and with an initial current direction pointing from top left corner to bottom right corner, its mirrored Hall effect device 1314 has a bias current rotating clockwise and with an initial current direction pointing from bottom left corner to top right corner.

In second the magnetic region 12, the Hall effect device 1321 has a bias current rotating clockwise and with an initial current direction pointing from bottom right corner to top left corner, its mirrored Hall effect device 1322 has a bias current rotating counterclockwise and with an initial current direction pointing from top right corner to bottom left corner; the Hall effect device 1323 has a bias current rotating counterclockwise and with an initial current direction pointing from top right corner to bottom left corner, its mirrored Hall effect device 1324 has a bias current rotating clockwise and with an initial current direction pointing from bottom right corner to top left corner.

In the example of FIG. 8, the operational amplifier 141 in each of the first and the second portions is configured to respectively sum the Hall voltages generated by the half Hall effect devices in the first magnetic region 11 at one side of the mid-line 1010 (both in the first magnetic region 11 and in the first portion 1011), and the Hall voltages generated by the half Hall effect devices in the second magnetic region 12 at one side of the mid-line 1010 (both in the second magnetic region 12 and in the first portion 1011), and to amplify a difference between the summed results to generate an amplified signal SA. That is:

$$V_{SA}=A\times[(V_{1311}+V_{1313})-(V_{1321}+V_{1323})]$$

wherein A represents a gain of the operational amplifier 141, $V_{SA}$ represents the voltage of the amplified signal SA, $V_{1311}$ represents the Hall voltage generated by the Hall effect device 1311, $V_{1313}$ represents the Hall voltage generated by the Hall effect device 1313, $V_{1321}$ represents the Hall voltage generated by the Hall effect device 1321, and $V_{1323}$ represents the Hall voltage generated by the Hall effect device 1323.

Figure 9:
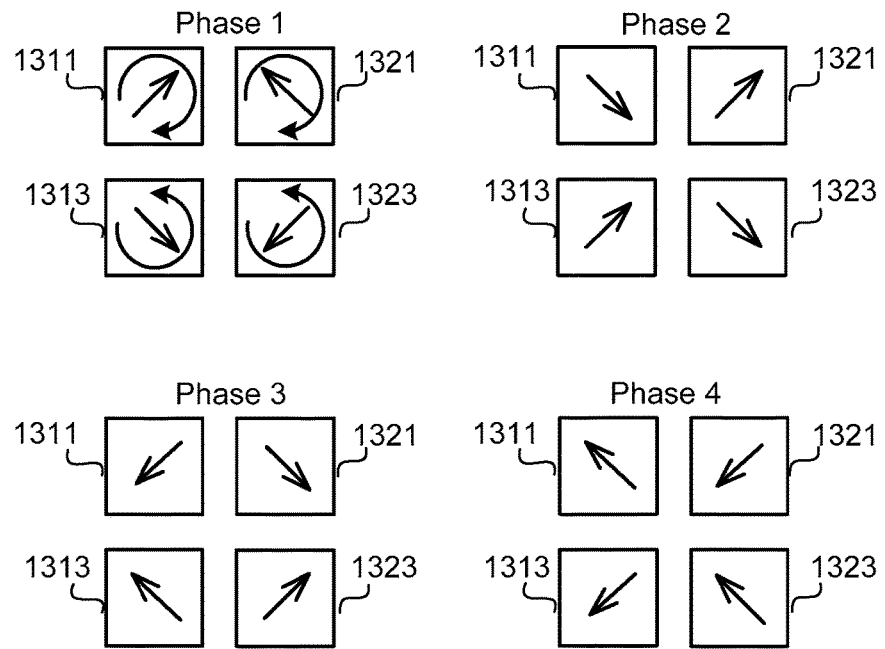
FIG. 9 schematically shows the variation of bias current direction applied to the four Hall effect devices in the first portion 1011 of FIG. 8 during 4 phases in one cycle in accordance with an embodiment of the present invention.

FIG. 9 schematically shows the variation of bias current direction applied to the four Hall effect devices in the first portion 1011 of FIG. 8 during 4 phases in one cycle in accordance with an embodiment of the present invention. As shown in FIG. 9, the bias current applied to the Hall effect device 1311 has a current direction from bottom left corner to top right corner at phase 1; it shifts from top left corner to bottom right corner at phase 2, shifts from top right corner to bottom left corner at phase 3, and shifts from bottom right corner to top left corner at phase 4.

The bias current applied to the Hall effect device 1321 has a current direction from bottom right corner to top left corner at phase 1; it shifts from bottom left corner to top right corner at phase 2, shifts from top left corner to bottom right corner at phase 3, and shifts from top right corner to bottom left corner at phase 4.

The bias current applied to the Hall effect device 1323 has a current direction from top right corner to bottom left corner at phase 1; it shifts from top left corner to bottom right corner at phase 2, shifts from bottom left corner to top right corner at phase 3, and shifts from bottom right corner to top left corner at phase 4.

The bias current applied to the Hall effect device 1313 has a current direction from top left corner to bottom right corner at phase 1; it shifts from bottom left corner to top right corner at phase 2, shifts from bottom right corner to top left corner at phase 3, and shifts from top right corner to bottom left corner at phase 4.

Figure 10:
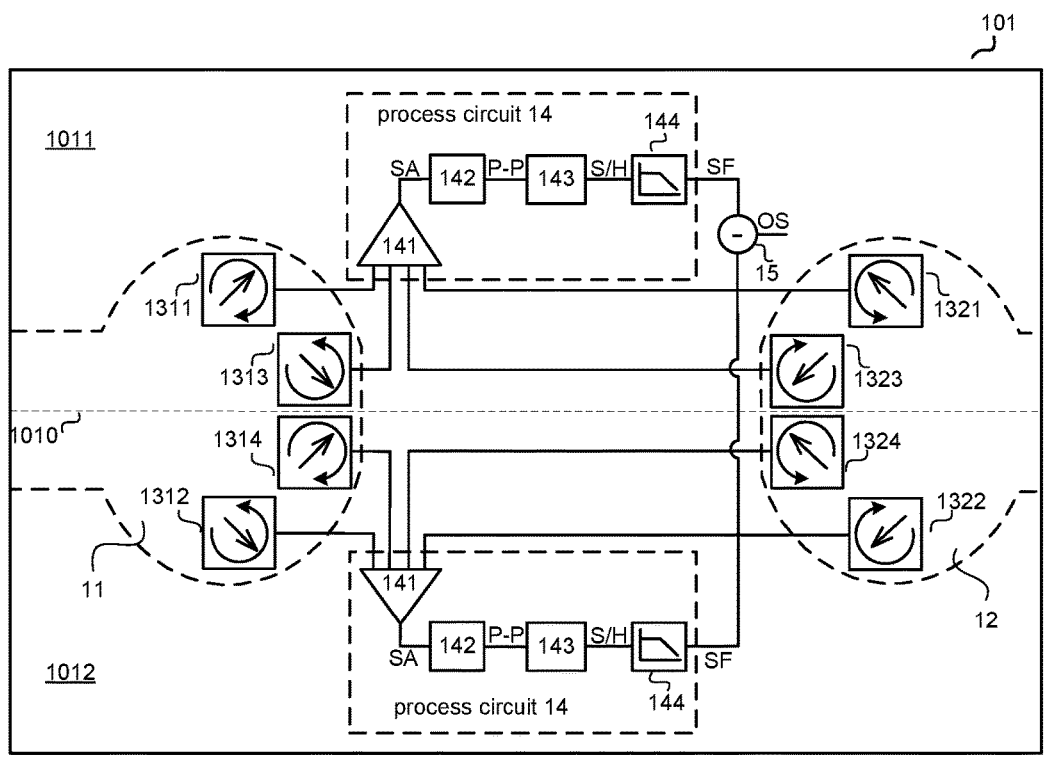
FIG. 10 schematically shows a circuit configuration of the silicon die 101 with four Hall effect devices in each of the magnetic regions in accordance with another embodiment of the present invention.

FIG. 10 schematically shows a circuit configuration of the silicon die 101 with four Hall effect devices in each of the magnetic regions in accordance with another embodiment of the present invention. In the example of FIG. 10, each of the magnetic regions also has two Hall effect devices placed in the first portion 1011 and the other two Hall effect devices placed in the second portion 1012. The two Hall effect devices in the first portion 1011 and the two Hall effect devices in the second portion 1012 are laid in a mirror way to each other along the mid-line 1010, and with mirror bias current directions and mirror spinning current schemes. The silicon die 101 in the example of FIG. 10 is similar to the silicon die 101 in the example of FIG. 8, with a difference that the biased current and the spinning direction applied to the Hall effect devices in the second magnetic region 12 are with another scheme.

Specifically, as shown in FIG. 10, in the first magnetic region 11, the Hall effect device 1311 has a bias current rotating clockwise and with an initial current direction pointing from bottom left corner to top right corner, its mirrored Hall effect device 1312 has a bias current rotating counterclockwise and with an initial current direction pointing from top left corner to bottom right corner; the Hall effect device 1313 has a bias current rotating counterclockwise and with an initial current direction pointing from top left corner to bottom right corner, its mirrored Hall effect device 1314 has a bias current rotating clockwise and with an initial current direction pointing from bottom left corner to top right corner, which are same to that in the example of FIG. 8. In the second the magnetic region 12, the Hall effect device 1321 has a bias current rotating counterclockwise and with an initial current direction pointing from bottom right corner to top left corner, its mirrored Hall effect device 1322 has a bias current rotating clockwise and with an initial current direction pointing from top right corner to bottom left corner; the Hall effect device 1323 has a bias current rotating clockwise and with an initial current direction pointing from top right corner to bottom left corner, its mirrored Hall effect device 1324 has a bias current rotating counterclockwise and with an initial current direction pointing from bottom right corner to top left corner.

Figure 11:
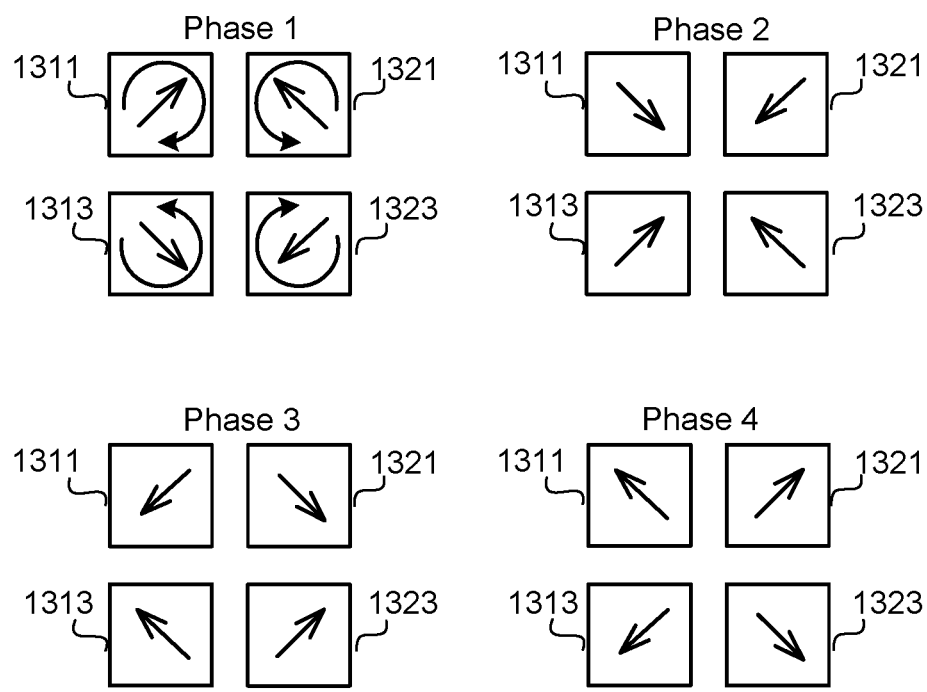
FIG. 11 schematically shows the variation of bias current direction applied to the four Hall effect devices in the first portion 1011 of FIG. 10 during 4 phases in one cycle in accordance with an embodiment of the present invention.

FIG. 11 schematically shows the variation of bias current direction applied to the four Hall effect devices in the first portion 1011 of FIG. 10 during 4 phases in one cycle in accordance with an embodiment of the present invention. As shown in FIG. 11, the bias current applied to the Hall effect device 1311 has a current direction from bottom left corner to top right corner at phase 1; it shifts from top left corner to bottom right corner at phase 2, shifts from top right corner to bottom left corner at phase 3, and shifts from bottom right corner to top left corner at phase 4.

The bias current applied to the Hall effect device 1321 has a current direction from bottom right corner to top left corner at phase 1; it shifts from top right corner to bottom left corner at phase 2, shifts from top left corner to bottom right corner at phase 3, and shifts from bottom left corner to top right corner at phase 4.

The bias current applied to the Hall effect device 1323 has a current direction from top right corner to bottom left corner at phase 1; it shifts from bottom right corner to top left corner at phase 2, shifts from bottom left corner to top right corner at phase 3, and shifts from top left corner to bottom right corner at phase 4.

The bias current applied to the Hall effect device 1313 has a current direction from top left corner to bottom right corner at phase 1; it shifts from bottom left corner to top right corner at phase 2, shifts from bottom right corner to top left corner at phase 3, and shifts from top right corner to bottom left corner at phase 4.

In this sense, the direction of the current for a given Hall effect device is always different from the currents of the others Hall effect devices.

Figure 12:
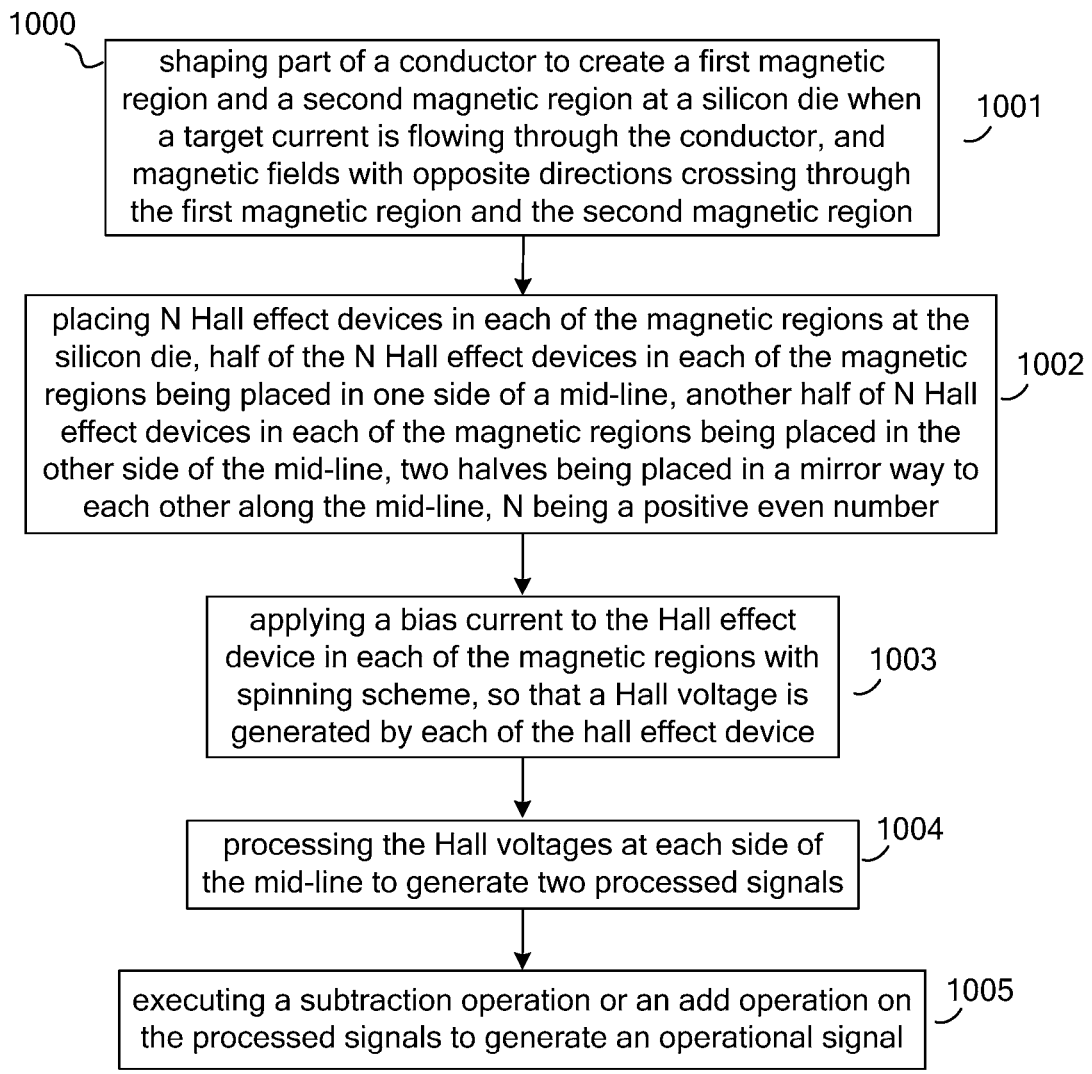
FIG. 12 schematically shows a flow chart 1000 of a current sensing method in accordance with an embodiment of the present invention.

Furthermore, the present invention provides a current sensing method. FIG. 12 schematically shows a flow chart 1000 of a current sensing method in accordance with an embodiment of the present invention. The method comprising:

Step 1001, shaping part of a conductor to create a first magnetic region and a second magnetic region with opposite magnetic field directions crossed therethrough at a silicon die when a target current is flowing through the conductor. In one embodiment, the conductor includes four fingers, with two fingers flowing into the target current, and the other two fingers flowing out the target current.

Step 1002, placing N Hall effect device in each of the magnetic regions at the silicon die, half of the N Hall effect devices in each of the magnetic regions being placed in one side of a mid-line, another half of N Hall effect devices in each of the magnetic regions being placed in the other side of the mid-line, the two halves of the Hall effect devices being placed in a mirrored way to each other along the mid-line, N being a positive even number. In one embodiment, the mid-line is a line along which the first magnetic region and the second magnetic region can be "folded", and divided into symmetric sections. In one embodiment, the Hall effect devices are placed along the boundary of the conductor.

Step 1003, applying a bias current to the Hall effect device in each of the magnetic regions with spinning scheme, so that a Hall voltage is generated by each of the Hall effect device. In one embodiment, the Hall effect devices at one side of the mid-line are applied with mirrored bias current direction and mirrored spinning current scheme with the Hall effect devices at the other side of the mid-line.

Step 1004, processing the Hall voltages at each side of the mid-line to generate two processed signals. And Step 1005, executing a subtraction operation or an add operation on the processed signals to generate an operational signal.

In one embodiment, the step of processing the Hall voltages comprises: respectively summing the Hall voltages of the half Hall effect devices in the first magnetic region at one side of the mid-line, and the Hall voltages of the half Hall effect devices in the second magnetic region at one side of the mid-line; amplifying a difference between the summed results to generate an amplified signal; detecting a difference between a maximum value and a minimum value of the amplified signal to generate a peak-peak signal; sampling and holding the peak-peak signal to generate a sample-hold signal; and filtering the sample-hold signal to generate the processed signal.

Several embodiments of the foregoing current sensing system and method provide better current sense compared to conventional technique. Unlike the conventional technique, several embodiments of the foregoing current sensing system shape part of the conductor in a way such that two regions with opposite magnetic field directions crossed therethrough are created at the silicon die. In addition, several embodiments of the foregoing current sensing system adopt differential (mirror) layout with mirror bias current and mirror spinning current scheme, which benefits from dv/dt (voltage variation) suppression of primary current loop, and immunes to parasitic magnetic fields, parasitic electric spikes due to switching and thermal drift of the electronics.

It is to be understood in these letters patent that the meaning of "A" is coupled to "B" is that either A and B are connected to each other as described below, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

This written description uses examples to disclose the invention, including the best mode, and also to enable a person skilled in the art to make and use the invention. The patentable scope of the invention may include other examples that occur to those skilled in the art.

What is claimed is:

1. A current sensing system, comprising:
a silicon die; and
a conductor, part of the conductor shaped to carry a target current in a way such that the target current flows through said part of the conductor in a first current path and a second current path with opposite current directions, so that a first magnetic region and a second magnetic region are created at the silicon die, and magnetic fields with opposite directions respectively crosses through the first magnetic region and the second magnetic region, the silicon die having N Hall effect devices in each of the magnetic regions, half of the N Hall effect devices in each of the magnetic regions being placed at one side of a mid-line, another half of N Hall effect devices in each of the magnetic regions being placed at the other side of the mid-line, the two halves of the Hall effect blocks being placed symmetrically with each other along the mid-line, N being a positive even number, each Hall effect device being applied with a bias current to provide a Hall voltage, wherein the silicon die further comprises:
two process circuits, configured to respectively process the Hall voltages from each side of the mid-line, to generate two processed signals; and
an operational unit, configured to execute a subtraction operation or an add operation on the two processed signals to generate an operational signal.

2. The current sensing system of claim 1, wherein each of the Hall effect devices is coupled to a switch box, and wherein each of the Hall effect devices comprises:
two pairs of connectors, one pair of connectors configured to receive the bias current, and the other pair of connectors configured to generate the Hall voltage; wherein the bias current running in the Hall effect device is controlled to be spinning between the two pairs of the connectors by the switch box.

3. The current sensing system of claim 1, wherein the process circuit comprises:
   an operational amplifier, configured to respectively sum the Hall voltages generated by the half Hall effect devices in the first magnetic region at one side of the mid-line, and the Hall voltages generated by the half Hall effect devices in the second magnetic region at one side of the mid-line, and to amplify a difference between the summed results to generate an amplified signal;
   a peak to peak detector, configured to generate a peak-peak signal indicative of the difference between a maximum value and a minimum value of the amplified signal;
   a sample and hold circuit, configured to generate a sample-hold signal indicative of the maximum value of the peak-peak signal; and
   a filter, configured to generate the processed signal based on the sample-hold signal.

4. The current sensing system of claim 1, wherein the Hall effect devices at one side of the mid-line are applied with mirrored bias current direction and mirrored spinning current scheme with the Hall effect devices at the other side of the mid-line.

5. The current sensing system of claim 1, wherein the mid-line is a line along which the first magnetic region and the second magnetic region are both divided into two symmetric halves.

6. The current sensing system of claim 1, wherein the Hall effect devices are placed in the first and second magnetic regions along the boundary of the conductor.

7. The current sensing system of claim 1, wherein the conductor has four fingers, with two fingers flowing into the target current, and the other two fingers flowing out the target current.

8. A current sensing method, comprising:
   shaping part of a conductor to carry a target current in a way such that the target current flows through said part of the conductor in a first current path and a second current path with opposite current directions, to create a first magnetic region and a second magnetic region at a silicon die, and magnetic fields with opposite directions crossing through the first magnetic region and the second magnetic region;
   placing N Hall effect devices in each of the magnetic regions at a silicon die, half of the N Hall effect devices in each of the magnetic regions being placed in one side of a mid-line, another half of N Hall effect devices in each of the magnetic regions being placed in the other side of the mid-line, the two halves of the Hall effect devices being placed in a mirrored way to each other along the mid-line, N being a positive even number;
   applying a bias current to the Hall effect device in each of the magnetic regions with spinning scheme, so that a Hall voltage is generated by each of the Hall effect devices;
   processing the Hall voltages at each side of the mid-line to generate two processed signals; and
   executing a subtraction operation or an add operation on the processed signals to generate an operational signal.

9. The current sensing method of claim 8, wherein the conductor includes four fingers, with two fingers flowing into the target current, and the other two fingers flowing out the target current.

10. The current sensing method of claim 8, wherein the step of processing the Hall voltage comprises:
   respectively summing the Hall voltages of the half Hall effect devices in the first magnetic region at one side of the mid-line, and the Hall voltages of the half Hall effect devices in the second magnetic region at one side of the mid-line;
   amplifying a difference between the summed results to generate an amplified signal;
   detecting a difference between a maximum value and a minimum value of the amplified signal to generate a peak-peak signal;
   sampling and holding the peak-peak signal to generate a sample-hold signal; and
   filtering the sample-hold signal to generate the processed signal.

11. The current sensing method of claim 8, wherein the Hall effect devices at one side of the mid-line is applied with a mirrored bias current direction and a mirrored spinning current scheme with the Hall effect devices at the other side of the mid-line.

12. The current sensing method of claim 8, wherein the mid-line is a line along which the first magnetic region and the second magnetic region are both divided into two symmetric halves.

13. The current sensing method of claim 8, wherein the Hall effect devices are placed along the boundary of the conductor.

14. A current sensing system, comprising:
   a silicon die; and
   a conductor, part of the conductor shaped to carry a target current in a way such that the target current flows through said part of the conductor in a first current path and a second current path with opposite current directions, so that a first magnetic region and a second magnetic region are created at the silicon die, and magnetic fields with opposite directions respectively crosses through the first magnetic region and the second magnetic region, the silicon die having a first portion and a second portion, each portion including:
   at least two Hall effect devices placed at the first and second magnetic regions, respectively, each Hall effect device being applied with a bias current to provide a Hall voltage, wherein the Hall effect devices in the first portion are laid in a mirrored way with the Hall effect devices in the second portion; and
   a process circuit, configured to process the Hall voltage to generate a processed signal; and wherein
   the silicon die further comprises: an operational unit, configured to execute a subtraction operation or an add operation on the processed signals to generate an operational signal.

15. The current sensing system of claim 14, wherein the Hall effect devices in the first portion are applied with mirrored bias current direction and mirrored spinning current scheme with the Hall effect devices in the second portion.

16. The current sensing system of claim 14, wherein the Hall effect devices are placed along the boundary of the conductor.

17. The current sensing system of claim 14, wherein the process circuit comprises:
   an operational amplifier, configured to respectively sum the Hall voltages generated by the half Hall effect devices placed in both of the first magnetic region and the corresponding portion, and the Hall voltages generated by the half Hall effect devices placed in both of the second magnetic region and the corresponding portion, and to amplify a difference between the summed results to generate an amplified signal;

a peak to peak detector, configured to generate a peak-peak signal indicative of the difference between a maximum value and a minimum value of the amplified signal;

a sample and hold circuit, configured to generate a sample-hold signal indicative of the maximum value of the peak-peak signal; and a filter, configured to generate the processed signal based on the sample-hold signal.

18. The current sensing system of claim 14, wherein the process circuit is placed either in the first portion or in the second portion.

* * * * *